(12) United States Patent
Claveau et al.

(10) Patent No.: US 6,894,566 B2
(45) Date of Patent: May 17, 2005

(54) ACTIVE LOAD DEVICE THAT ENABLES BIASING OF A VERY WIDE BAND DISTRIBUTED AMPLIFIER CIRCUIT WITH GAIN CONTROL

(75) Inventors: Regis Claveau, Trebeurden (FR);
Robert Soares, Perros Guirec (FR);
Benoît Boumard, Lannion (FR);
Abdenour Chelouah, Lannion (FR)

(73) Assignee: Da-Lightcom, Lannion (FR)

( * ) Notice: Subject to any disclaimer, the term of this patent is extended or adjusted under 35 U.S.C. 154(b) by 9 days.

(21) Appl. No.: 10/625,210

(22) Filed: Jul. 22, 2003

(65) Prior Publication Data

US 2004/0124924 A1 Jul. 1, 2004

(30) Foreign Application Priority Data

Jul. 23, 2002 (FR) ............................................. 02 09335

(51) Int. Cl.[7] ................................................. H03F 3/60
(52) U.S. Cl. ......................... 330/286; 330/54; 330/295
(58) Field of Search ............................ 330/53, 54, 84, 330/124 R, 179, 277, 286, 295, 310, 311

(56) References Cited

U.S. PATENT DOCUMENTS

| | | | |
|---|---|---|---|
| 4,586,004 A | * | 4/1986 | Valdez ........................ 330/300 |
| 5,196,805 A | | 3/1993 | Beckwith et al. |
| 5,880,640 A | | 3/1999 | Dueme |
| 5,920,230 A | * | 7/1999 | Beall ........................... 330/295 |
| 6,400,226 B2 | * | 6/2002 | Sato ............................ 330/286 |
| 6,472,941 B2 | * | 10/2002 | Shigematsu ................. 330/286 |

OTHER PUBLICATIONS

Versnaeyen C. et al., "Realisation De Macro Composants Hyperfrequences En Technologie Monolithique", Revue De Physique Appliquee, Les Editions De Physique, vol. 23. No. 7, Jul. 1, 1998, pp. 1215–1218, figure 8.

* cited by examiner

*Primary Examiner*—Khanh V. Nguyen
(74) *Attorney, Agent, or Firm*—Blakely Sokoloff Taylor Zafman

(57) ABSTRACT

The invention relates to a very wide band amplifier circuit including a distributed amplification cell (100) connected to a biasing cell (200), the amplification cell (100) including several transistors (T1) connected in parallel between a drain line and a grid line, each terminated at one of its ends by a load (Zin, Zout), the biasing cell (200) including at least one transistor (T2) connected between a power source ($V_{DD}$) and the drain line of the amplification cell (100), said biasing cell having an overall impedance equal to the impedance of the load (Zout) connected to the end of the drain line of the amplification cell (100), characterized in that the grid (G2) of the transistor (T2) of the biasing cell (200) is connected to the node (201) of a divider bridge (R1R2, R1T3) so as to set its grid (G2) potential ($V_{G2}$), and in that the grid (G2) and the source (S2) of said transistor (T2) are connected together by means of at least one capacitor (C1, C2).

10 Claims, 6 Drawing Sheets

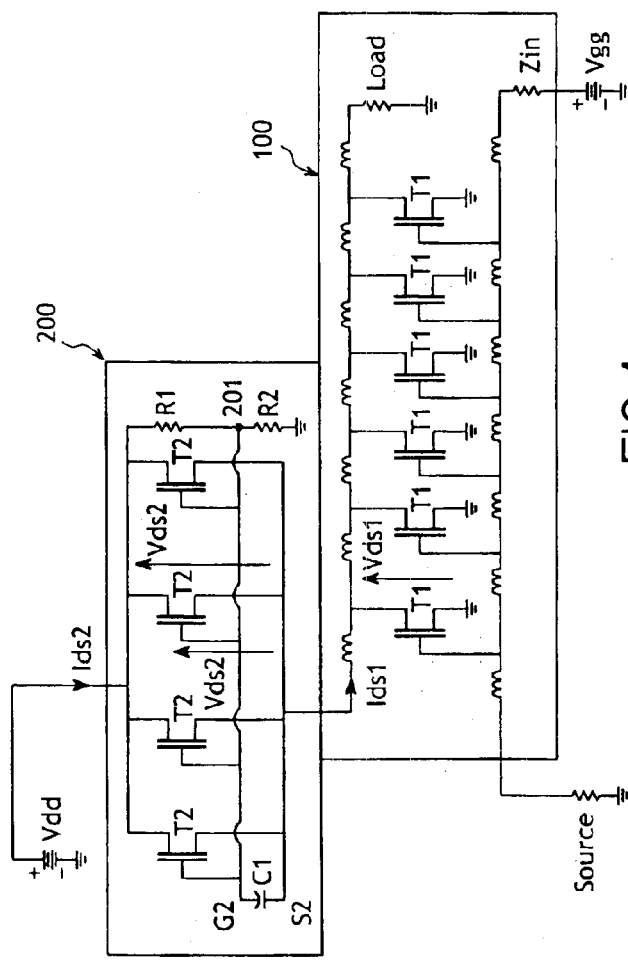
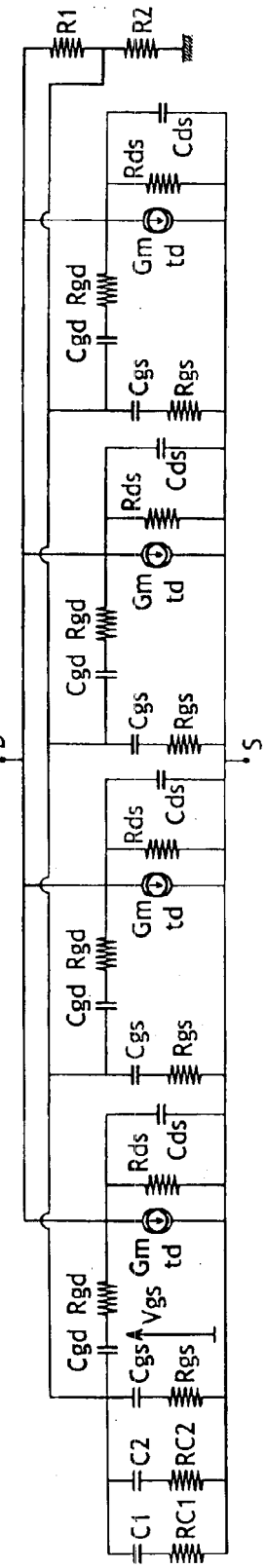
FIG.4
FIG.5

ACTIVE LOAD DEVICE THAT ENABLES BIASING OF A VERY WIDE BAND DISTRIBUTED AMPLIFIER CIRCUIT WITH GAIN CONTROL

BACKGROUND OF THE INVENTION

1. Field of the Invention

This invention relates to the field of amplifiers, more particularly integrated amplifiers of the MMIC type (Monolithic Microwave Integrated Circuit).

These circuits make it possible to amplify signals over a very wide frequency band (from continuous to 100 GHz) and are generally used in optical telecommunications applications.

2. Description of Related Art

FIG. 1 represents an example of a distributed amplifier. An amplifier such as this comprises a series of amplifier cells connected between two transmission lines. The one (grid line) is connected at its end to an input impedance Zin (termination), the other (drain line) is connected at its end to an output impedance Zout (termination).

Distributed amplifiers have the advantage of bypassing the frequency limitations of conventional amplifiers. For an ideal adaptation of the input and output lines, the termination impedances, Zin and Zout respectively, must have the same value as the characteristic impedance of their respective lines.

One of the problems posed by these distributed amplifiers concerns their voltage and direct current bias. As illustrated in FIG. 2, the bias voltage and the associated direct current can be supplied by a biasing circuit produced on the outside of the MMIC integrated circuit.

The biasing circuit includes a series of self-inductors connected to a voltage source in order to bring the direct voltage and current to the drain line of the distributed amplifier.

In this case, the amplifier is biased by the radiofrequency (RF) output path.

The primary difficulty is to produce such a device over a very wide frequency band (20 kHz to 100 GHz) with high current restrictions, small RF losses and good reflection factors.

In addition, the biasing circuit is cumbersome, which poses a problem when integrating it into small-size housings required for increased frequencies.

In order to eliminate these disadvantages, one solution consists of biasing the distributed amplifier through the Zout output line termination. This solution makes it possible to both satisfy the needs for a proper termination of this line and to bias the amplifier correctly.

However, for applications demanding a high output power, the distributed amplifier requires a high biasing voltage and a strong direct current. In the case of these applications, biasing the amplifier through the resistive Zout termination leads to a sharp drop in voltage at the terminals of the resistor and causes heat dissipation problems to appear.

In addition, the dimensioning of the load resistor brings with it a high stray capacitance.

This solution is therefore viable only on condition of accepting a degradation of the performance of the amplifier.

In order to overcome these difficulties, another solution consists of using an active load composed of saturable loads (field-effect transistors with their drain-source voltage saturated) for producing the Zout termination.

FIG. 3 represents a distributed amplifier including an active load such as this. The active load is composed of a set of transistors connected in parallel between a voltage source $V_{DD}$ and the drain line of the distributed amplifier. Each transistor has its grid connected to its source. This active load makes it possible to bias the distributed amplifier and obtain a satisfactory line termination while preventing the disadvantages linked to biasing through a resistive load.

The active load is calculated to satisfy the following conditions:

$$V_{DS1}+V_{DS2}=V_{DD}$$

$$I_{DS1}=I_{DS2}$$

$$Zca \approx Zout \text{ for } V_{DS2} > V_{DSsat}$$

Where $V_{DS1}$ is the drain-source voltage of the amplification cell, $V_{DS2}$ is the drain-source voltage of the active load, $V_{DD}$ is the supply voltage, $I_{DS1}$ is the current delivered to the amplification cell, $I_{DS2}$ is the current supplied by the active load, Zca is the impedance of the active load and $V_{DSsat}$ is the drain-source saturation voltage of the transistors of the active load.

One disadvantage of this solution is that the active load does not make it possible to obtain a stable Zout impedance if the direct current $I_{DS1}$ (=$I_{DS2}$) varies, e.g., in the case of a gain control.

When the current $I_{DS1}$ becomes weaker, the transistors making up the active load can leave their saturated operating zone and operate in their linear zone. The result of this is:

that the impedance of the active load becomes weak and the condition Zca=Zout is no longer respected.

that the continuous biasing of the distributed amplifier is modified.

BRIEF SUMMARY OF THE INVENTION

Therefore, one purpose of the invention is to furnish an active load for a distributed amplifier making it possible to maintain the biasing conditions of the amplifier and to preserve the condition Zca=Zout independently of the current that passes through the active load.

To this end, the invention proposes a very wide band amplifier circuit including a distributed amplification cell connected to a biasing cell, the amplification cell including several transistors connected in parallel between a drain line and a grid line, each terminated at one of its ends by a load (Zin, Zout), the biasing cell including at least one transistor connected between a power source and the drain line of the amplification cell, said biasing cell having an impedance equal to the impedance of the load (Zout) connected to the end of the drain line of the amplification cell, characterized in that the grid of the transistor of the biasing cell is connected to a divider bridge so as to set its grid potential, and in that the grid and the source of said transistor are connected together by means of at least one capacitor.

The fact of setting the grid potential of the active load and of leaving the potential of its source "floating," makes it possible to ensure that the drain-source voltage $V_{DS2}$ of the biasing cell is always higher than the saturation voltage of the transistors of this cell, regardless of the value of the current $I_{DS1}$ passing through the amplifier. The invention therefore makes it possible to guarantee that these transistors will operate in their saturated zone.

More particularly, the invention relates to a biasing cell which likewise functions as a Zout load for a distributed amplifier circuit, composed of an active load device including at least one transistor, designed to be connected between a power supply and a drain line, characterized in that the grid of the transistor of the active load is connected to a bridge divider so as to set its grid potential and in that the grid and the source are connected together by means of at least one capacitor.

BRIEF DESCRIPTION OF THE DRAWINGS

Other characteristics and advantages will become more apparent from the following description, which is purely illustrative and non-limiting and must be read in relation to the appended drawings wherein:

FIG. 4 represents an example of an amplifier assembly including an active load, according to an embodiment of the invention, FIG. 5 represents a circuit equivalent to the active load of the circuit of FIG. 4, FIGS. 6 to 12 represent examples of active loads capable of being used within the framework of the invention.

DETAILED DESCRIPTION OF THE INVENTION

Figure 1:
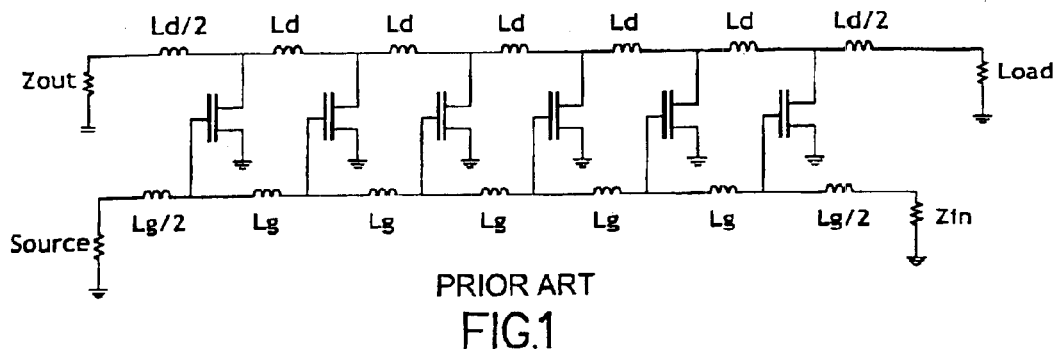
FIG. 1, which has already been commented on, represents an example of a distributed amplifier circuit, FIG. 2, which has already been commented on, represents an example of an amplifier circuit including a biasing circuit, according to a prior art embodiment, FIG. 3, which has already been commented on, represents an example of an amplifier circuit including an active load, according to another prior art embodiment.
Figure 2:
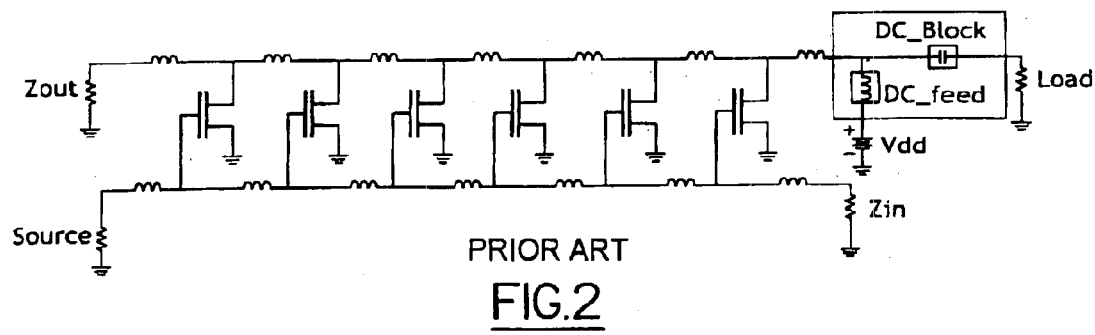
Figure 3:
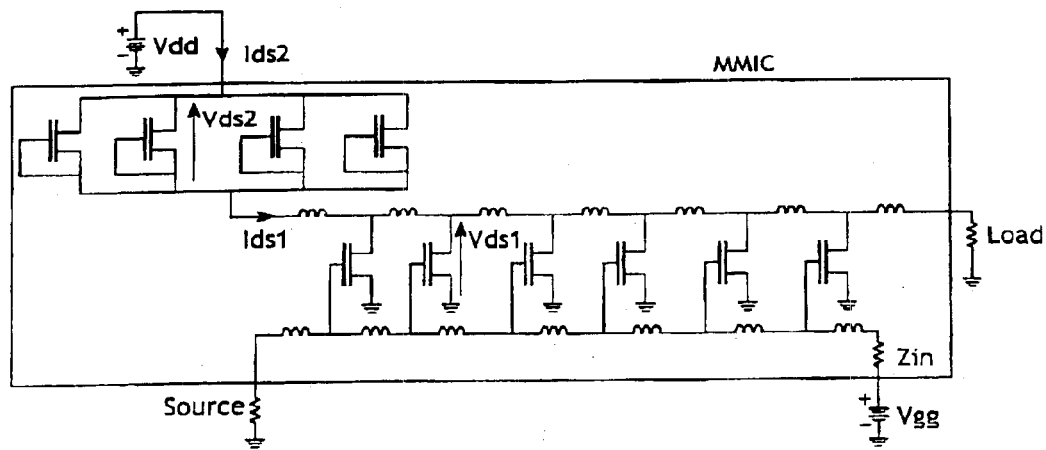

In FIG. 4, the amplifier assembly includes an amplification cell 100 including transistors T1 connected in parallel between a drain line and a grid line, as well as a biasing cell 200 connected between a power supply $V_{DD}$ and the drain line of the amplification cell 100.

The biasing cell 200 includes a plurality of transistors T2 connected in parallel between the power supply $V_{DD}$ and the drain line of the amplification cell 100. The biasing cell also includes a divider bridge R1R2 connected between the power supply $V_{DD}$ and the ground and whose node 201 is connected to the grids of the transistors T2. This divider bridge makes it possible to set the grid potentials of the transistors T2 while their source S2 is left floating.

The assembly of FIG. 4 makes it possible to ensure that the condition $V_{DS2}>V_{DSsat}$ is respected regardless of the value of the current $I_{DS1}=I_{DS2}$. In an assembly such as this, a lowering of the current is accompanied by a simultaneous contribution of $V_{GS2}$ and $V_{DS2}$. In the beginning, the biasing direct current is set for a desired operating condition (e.g., in order to obtain maximum gain), and the divider bridge is calculated so that the grid and source potentials of the active load are equal. The values of the resistors R1 and R2 are selected in order to minimize the current in the bridge.

To improve the performance of the assembly at low frequencies, the real part of the impedance Zca of the active load becoming too low, a capacitor C1, having a capacitance value (e.g., 150 nF) making it possible to obtain the desired low cut-off frequency (in this case 20 kHz), is connected between the grid G2 and the source S2 of the transistors T2 of the biasing cell. This capacitor can be physically implanted outside of the MMIC integrated circuit. To this end, it is connected by connecting wires to the nodes G2 and S2 of the transistors T2.

In actual practice, the presence of parasitic connection elements (connecting wires and lines) necessitates the integration of at least one additional capacitor C2 between these same nodes G2 and S2, as close as possible to the transistors of the active load.

The values of the elements used are selected so that the entire device best maintains the condition Zca=Zout over the range of frequencies used.

FIG. 5 represents an equivalent diagram of the active load of FIG. 4, also including the additional capacitor C1 and C2. This equivalent diagram is given for an active load including four field-effect transistors T2 as well as two capacitors, the one C2 on the MMIC chip and the other C1 on the outside. The active load must allow the biasing direct current $I_{DS2}$ to pass (i.e., have an adequate transconductance gm) and have an adapted impedance $R_{DS}$. The values of the equivalent elements depend on the grid development W and on the biasing of the transistor (index 0):

$$Rgs = \frac{Rgs_0}{W}$$

$$Rgd = \frac{Rgd_0}{W}$$

$$Rds = \frac{Rds_0}{W}$$

$Cgs=Ggs_0 \times W$ $Cgd=Cgd_0 \times W$ $Cds=Cds_0 \times W$ $gm=gm_0 \times W$ From the equivalent diagram of FIG. 5, the formula for the Zca impedance of the active load is extracted:

$$Zca = \frac{V_{DS}}{I_{DS1}} = \frac{1}{\frac{4}{R_{DS}} + 4j\omega C_{DS} + \frac{1+4gm \cdot Zgs}{Zds}}$$

Figure 6:
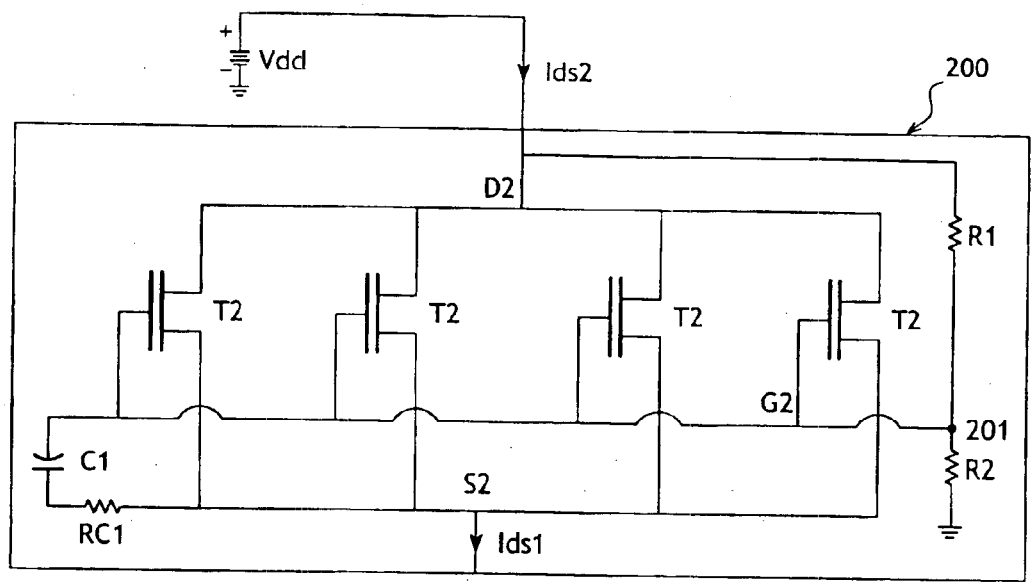

FIG. 6 represents another example of the biasing cell similar to that of the assembly of FIG. 4 but wherein a resistor $R_{C1}$ has been added in series with the capacitor C1 between the grid G2 and the source S2 of the active load. This resistor plays a damping role. In addition, this resistor modifies the value of the impedance of the active load and enables an improved behavior of the active load while making it possible to best approximate the condition Zca=Zout over the frequency range used.

Figure 7:
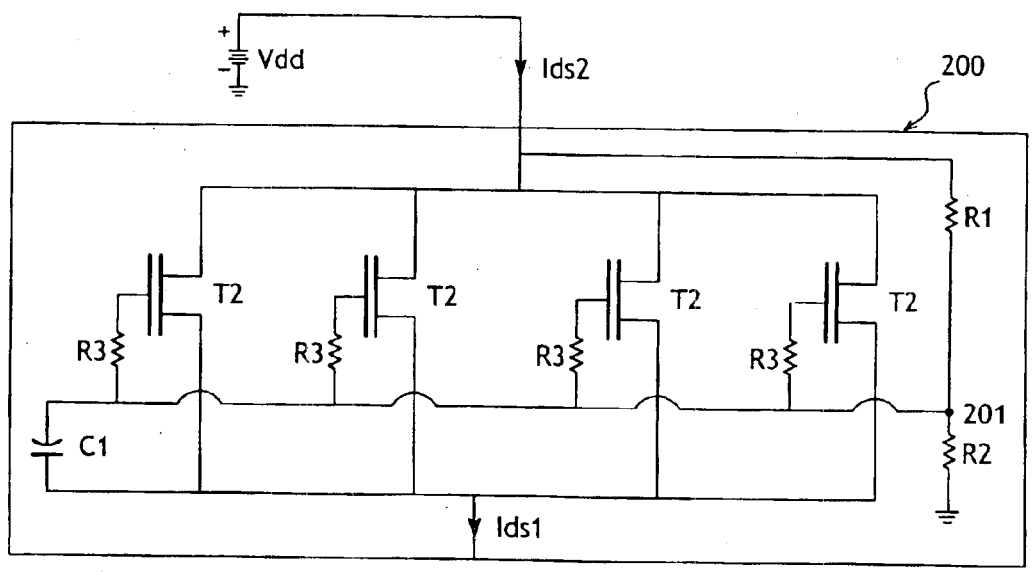

FIG. 7 represents another example of a biasing cell similar to that of the assembly of FIG. 4 but wherein resistors R3 have been added, each of these resistors R3 being connected between the grid G2 of a transistor T2 and the divider bridge. These resistors R3 play a damping role in order to prevent possible resonance peaks. However, this configuration is generally less effective than that of FIG. 6.

Figure 8:
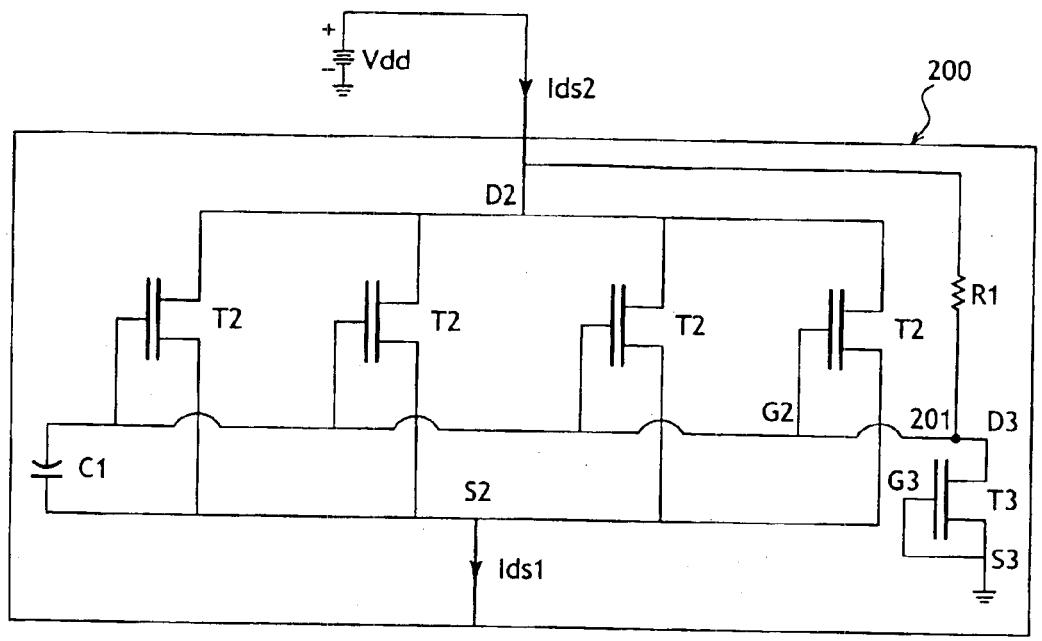

FIG. 8 represents another example of a biasing cell similar to that of the assembly of FIG. 4 but wherein the resistor R2 of the divider bridge has been replaced by a field-effect transistor T3 having its grid G3 and its source S3 short-circuited. This assembly makes it possible to achieve the same resistor R2 value while using a more compact structure.

Figure 9:
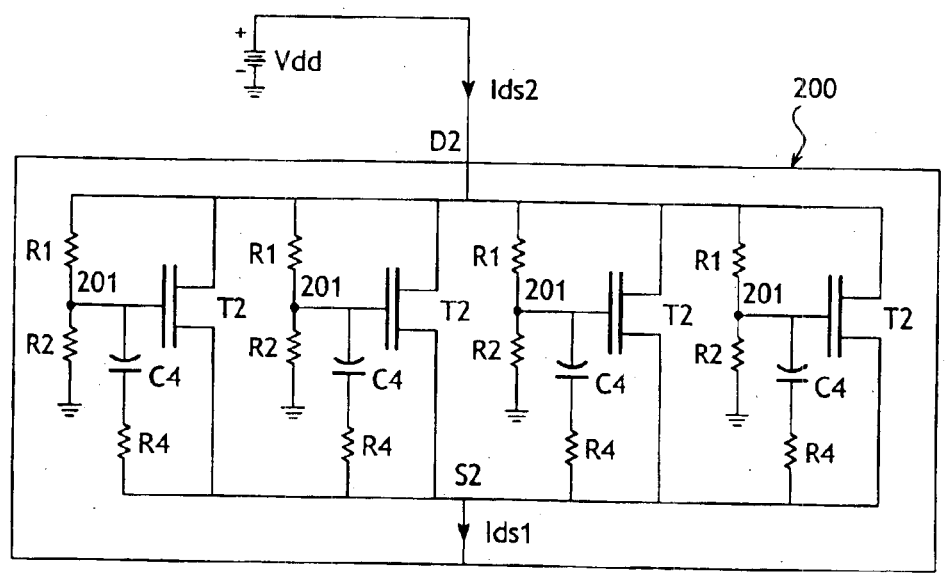

FIG. 9 represents an example of a biasing cell wherein each transistor T2 of the active load is connected by its grid G2 to a divider bridge R1R2. A capacitor C4 arranged in series with a resistor R4 is connected between the grid G2 and the source S2 of each of the transistors T2 of the active load. This assembly leads to more cumbersome circuits than the assemblies of FIGS. 4 to 8, but might make it possible to achieve a load that is more constant within the band of frequencies used and closer to the ideal condition Zca=Zout.

Figure 10:
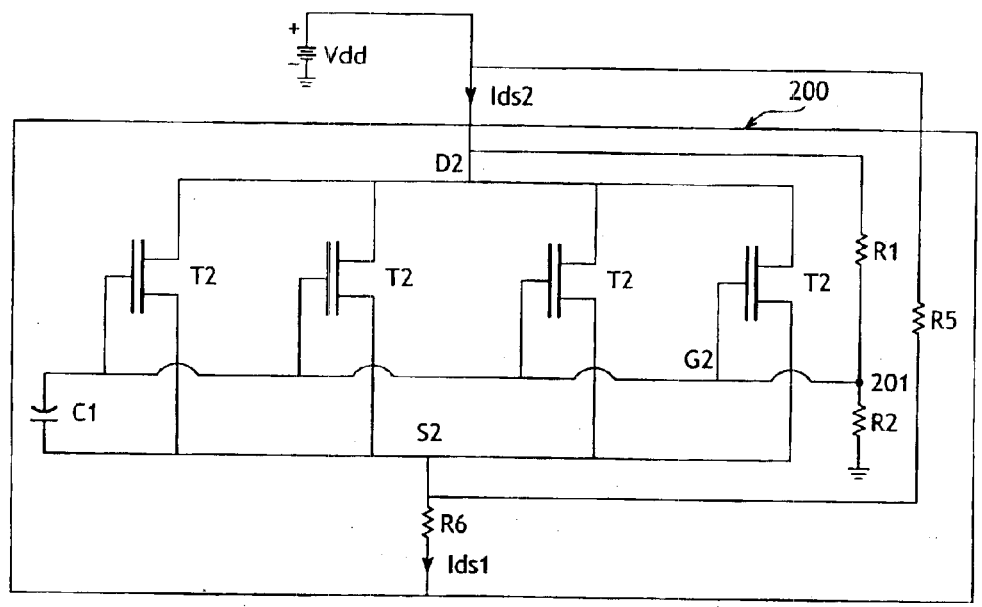

FIG. 10 represents another example of a biasing cell similar to that of the assembly of FIG. 4 but including one or more resistors R5 mounted in parallel with the active load. Optionally, the cell likewise includes one or more resistors R6 mounted in series with the active load in order to adapt the impedance of the active load. The fact of adding additional resistors makes it possible to come close to the desired properties for the biasing cell, namely $I_{DS1}=I_{DS2}$ and Zca=Zout.

Figure 11:
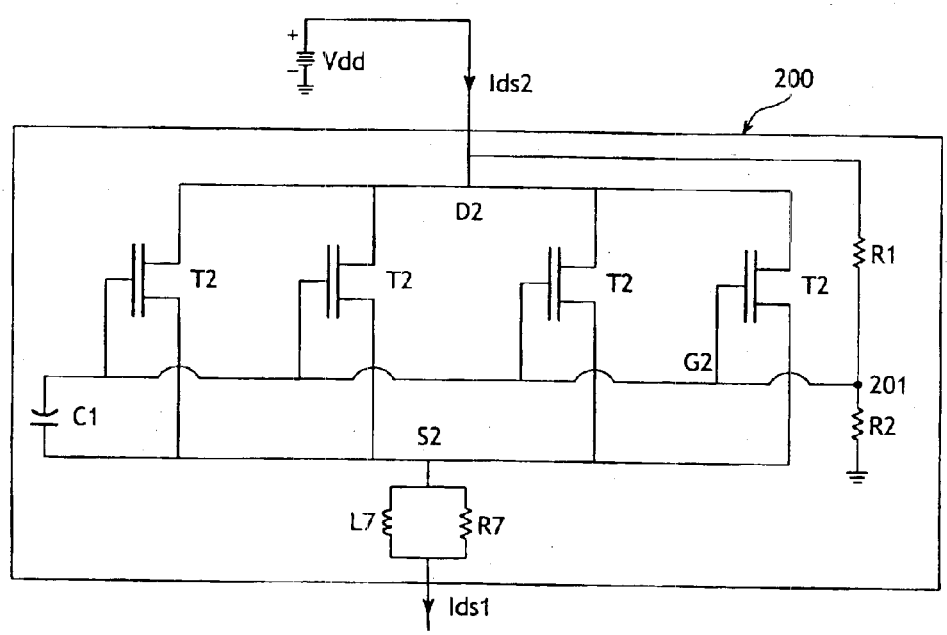

FIG. 11 represents another example of a biasing cell similar to that of the assembly of FIG. 4 but including an inductor L7 and resistor R7 arranged in parallel. The resistor R7 and the inductor L7 are mounted in series with the active load. An assembly such as this makes it possible to increase the real part of the active load to high frequencies and to therefore approximate the conditions $I_{DS1}=I_{DS2}$ and Zca=Zout.

Figure 12:
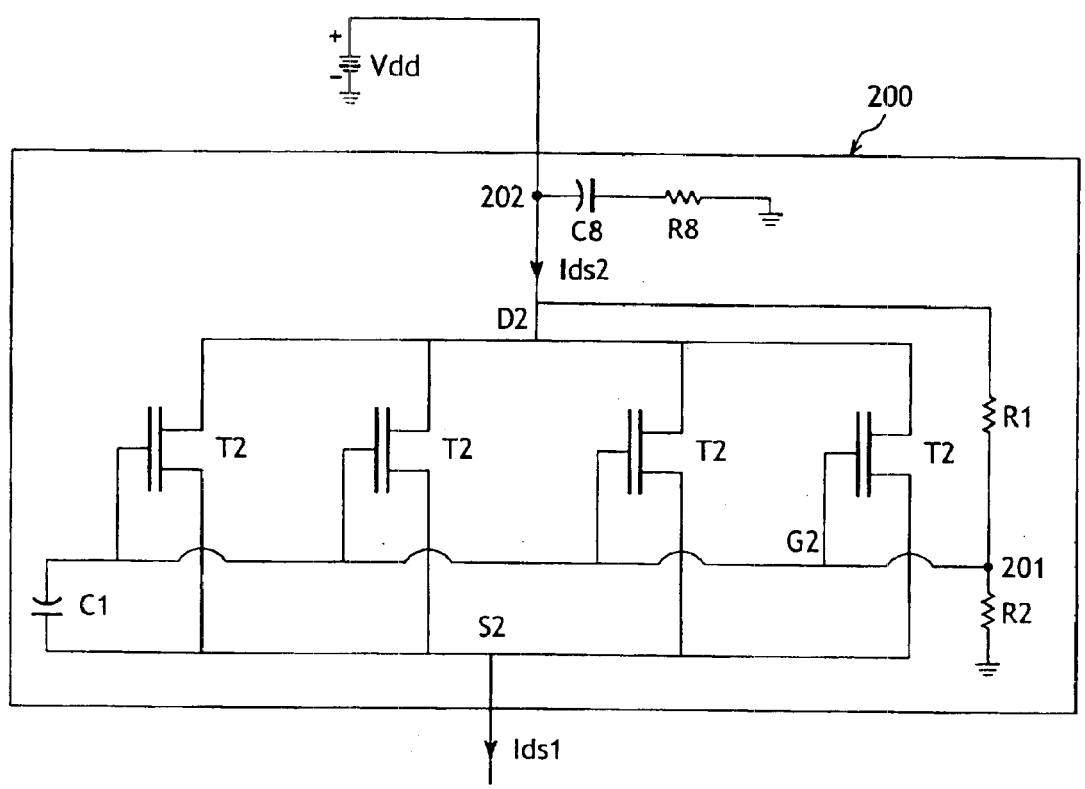

Finally, FIG. 12 represents another example of an assembly similar to that of the assembly of FIG. 4 but including resistors R8 arranged in series with by-pass capacitors C8 connected between the node 202 corresponding to the drains D2 of the transistors T2 and the ground. This assembly likewise makes it possible to increase the real part of the active load. This arrangement can be used in combination with the assembly of FIG. 11, which further improves the result.

What is claimed is:

1. Very wide band amplifier circuit including a distributed amplification cell (100) connected to a biasing cell (200), the amplification cell (100) including several transistors (T1) connected in parallel between as drain line and a grid line, each terminated at one of its ends by a load (Zin, Zout), the biasing cell (200) including at least one transistor (T2) connected between a power source ($V_{DD}$) and the drain line of the amplification cell (100), said biasing cell having an overall impedance equal to the impedance of the load (Zout) connected to the end of the drain line of the amplification cell (100), characterized in that the grid (G2) of the transistor (T2) of the biasing cell (200) is connected to the node (201) of the divider bridge (R1R2, R1T3) so as to set its grid (G2) potential $V_{G2}$), and in that the grid (G2) and the source (S2) of said transistor (T2) are connected together by means of at least one capacitor (C1, C2).

2. Amplifier circuit as claimed in claim 1, characterized in that it includes a resistor (R) mounted in series with the capacitor (C) between the grid (G2) and the source (S2) of the transistor (T2) of the biasing cell (200).

3. Amplifier circuit as claimed in claim 1 or claim 2, characterized in that it includes a resistor (R3) connected between the grid (G2) of the transistor (T2) and the node (201) of the divider bridge (R1R2, R1T3).

4. Amplifier circuit as claimed in claim 1 or claim 2, characterized in that the divider bridge (R1T3) includes at least one transistor (T3).

5. Amplifier circuit as claimed in claim 1 or claim 2, characterized in that the biasing cell (200) includes several transistors (T2) arranged in parallel and several divider bridges (R1R2) arranged in parallel and in that each of the transistors (T2) is connected by its grid (G2) to one of the divider bridges (R1R2).

6. Amplifier circuit as claimed in claim 1 or claim 2, characterized in that it includes at least one resistor (R5) mounted in parallel with the biasing cell (200).

7. Amplifier circuit as claimed in claim 1 or claim 2, characterized in that it includes at least one resistor (R6) mounted in series with the biasing cell (200).

8. Amplifier circuit as claimed in claim 1 or claim 2, characterized in that it includes an inductor (L7) and a resistor (R7) arranged in parallel, mounted in series with the biasing cell (200).

9. Amplifier circuit as claimed in claim 1 or claim 2, characterized in that it includes at least one resistor (R8) and one capacitor (C8) arranged in series, connected between the drain (D2) of the transistor (T2) and the ground.

10. Biasing cell (200) for amplifier circuit, characterized in that it includes at least one transistor (T2) designed to be connected between a power supply ($V_{DD}$) and a drain line of an amplification, cell (100), characterized in that the grid (G2) of the transistor (T2) of the biasing cell (200) is connected to the node (201) of a divider bridge (R1R2, R1T3) so as to set its grid (G2) potential ($V_{G2}$), and in that the grid (G2) and the source (S2) of said transistor (T2) are connected together by means of at least one capacitor (C1, C2).

* * * * *